United States Patent [19]

Chapman et al.

[11] Patent Number: 4,965,408

[45] Date of Patent: Oct. 23, 1990

[54] COMPOSITE SHEET MATERIAL FOR ELECTROMAGNETIC RADIATION SHIELDING

[75] Inventors: Dwight E. Chapman, Columbus; David A. DeProspero, Upper Arlington, both of Ohio

[73] Assignee: Borden, Inc., Columbus, Ohio

[21] Appl. No.: 304,575

[22] Filed: Feb. 1, 1989

[51] Int. Cl.$^5$ ............................................. H05K 9/00
[52] U.S. Cl. ................................. 174/35 MS; 361/424
[58] Field of Search .................. 174/35 R, 35 MS, 36; 361/424

[56] References Cited

U.S. PATENT DOCUMENTS

| | | | |
|---|---|---|---|
| 2,226,589 | 12/1940 | Smyers | 154/46 |
| 2,702,580 | 2/1955 | Bateman | 154/37 |
| 3,511,355 | 5/1970 | Uddenborg | 181/33 |
| 4,039,709 | 8/1977 | Newman | 428/159 |
| 4,096,304 | 6/1978 | Greengrass | 428/138 |
| 4,205,110 | 5/1980 | Jean | 428/213 |
| 4,296,162 | 10/1981 | Jean | 428/213 |
| 4,471,015 | 9/1984 | Ebneth | 428/195 |
| 4,486,490 | 12/1984 | Patz | 428/245 |
| 4,507,354 | 3/1985 | Ishikawa | 428/245 |
| 4,582,661 | 4/1986 | Ito | 264/277 |
| 4,647,495 | 3/1987 | Kanayama | 428/246 |
| 4,647,714 | 3/1987 | Goto | 174/35 MS X |
| 4,750,957 | 6/1988 | Gustafson | 174/35 MS X |

FOREIGN PATENT DOCUMENTS 27290 4/1981 European Pat. Off. .
57-201651 12/1982 Japan .

OTHER PUBLICATIONS

"Wallpaper Protects Against EMI" EDN, Nov. 3, 1988.
"Architectural Shielding with Advanced Nonwoven Structures" Fahy, Lawrence J.

Primary Examiner—Leo P. Picard
Assistant Examiner—David A. Tone
Attorney, Agent, or Firm—Sidney W. Millard

[57] ABSTRACT

A radiation shielding laminate includes a layer of a polymeric or copolymeric film; a layer of metal foil; an adhesive in an amount sufficient to bond the metal and the polymeric or copolymeric layers together. A thin metal strip bridging two adjacent laminates is a means by which electricity may flow from one sheet to another and to attach an electrical ground to the layer of metal foil. An optional backing layer may be bonded to the sheet material on the opposite side of the layer of metal foil from the film.

19 Claims, 3 Drawing Sheets

COMPOSITE SHEET MATERIAL FOR ELECTROMAGNETIC RADIATION SHIELDING

FIELD OF THE INVENTION

This invention relates to an electrically conducting laminate suitable for a wall covering and the process of using the laminate.

BACKGROUND OF THE INVENTION

Electromagnetic radiation, natural and man-made, can often impair the functioning of electrical or electronic equipment. Such radiation can also interfere with the storage of information on computer diskettes. Further, there is a need to provide security against electronic surveillance of, and/or electronic interference with, proprietary electronic data. It is also believed that exposure to radiation of certain wavelengths may have adverse health effects on humans, as well as possibly affecting human behavior patterns.

The transmission by electrical means of information may involve propagation of energy by electromagnetic waves. Electromagnetic waves can be transmitted and received by antennae. An antenna consists of suitably disposed conductors which will radiate electromagnetic energy when connected to a source at an appropriate frequency. When the antenna is being excited, a distribution of current will exist over all the conduction surfaces, which distribution is determined by the conductor geometry and the frequency of the source.

An electromagnetic field at various power frequencies exists in most inhabited areas. This field results from various forms of lighting, power distribution equipment, powered instruments, machinery, and so on.

All efforts in shielding a room are directed towards reducing unwanted electromagnetic signal pickup. Electromagnetic shielding is often required at one or more locations within the electromagnetic field created. A second shield often must be utilized to contain currents caused by, for example, transformer voltages. The number of separate shields desired in a system may depend on the number of independent signals being processed through an electrical device, plus one for each power entrance.

Known methods for rendering objects, such as rooms and electronic machinery, secure against such electromagnetic interference or surveillance include the construction of sheet-metal encased rooms. A second "room-within-a-room" is then constructed with desirable aesthetics. This double wall procedure can be very expensive. Alternatively, electrical transformers can be made to order with special shields at additional costs. A Faraday shield is another shielding or grounding technique and utilizes a layer of copper or aluminum foil laid between electrical coils. Further insulation applied over the foil permits a second shield to cover the first, if required. Faraday shields, however, are only moderately effective, and mutual capacitances to points outside of the shield can be 50 to 100 picoFarad. Wraps of copper or aluminum can be folded to box in the sides of an electrical coil, thereby providing a very tight shield. However, such box shields are labor intensive and expensive, and problems with mutual capacitance, pinhole leakage and shorted turns exist.

Shields can also be made of conductive paper as well as nonferrous metal foil. A paper shield has the advantage of being thin and inexpensive, but may suffer from lack of strength and handleability.

It is also known to use metal foil in wall covering materials. Such materials are especially useful as barriers against the transmission of vapor and/or heat, or in furnishing flame resistance. U.S. Pat. Nos. 4,296,162 and U.S. Pat. No. 4,205,110 disclose thin flexible covering materials which provide heat and vapor barriers for walls or ceilings. The patents teach the use of a layer of vinyl and/or cloth and a metal foil and disclose composites wherein the metal foil is sandwiched between paper or fabric and vinyl. Neither patent teaches electromagnetic shielding.

U.S. Pat. No. 4,647,714 discloses a composite sheet material used for shielding magnetism and electromagnetic waves. However, the composites require electrodeposited iron foil as the core and two metal plating layers. It further teaches that sufficient shielding effects cannot be expected from plastics laminated with aluminum foil.

For electromagnetic radiation shielding it is most desirable to create a continuous electrically conductive barrier around the object. This facilitates the use of a single point ground which is useful in security applications, whereby once one portion of the conductive barrier is grounded, the entire barrier surrounding the object is fully grounded.

SUMMARY OF THE INVENTION

The present invention relates to a flexible, multilayer surface-covering radiation shielding laminate which provides electromagnetic shielding for objects to which it is applied. The laminates of the present invention reduce or eliminate the transmission of electromagnetic radiation through the laminate by absorbing or partially absorbing the radiation. This attenuation of electromagnetic radiation is particularly significant in the protection from electronic surveillance or destruction of proprietary electronic data.

The present invention also relates to a process for protecting electronic data from outside intruders where the data is within an object such as a building, computer or a room. Such surveillance or destruction by the application of electromagnetic energy is minimized because of surface-covering, electrically conducting, grounded laminate materials.

Objects of the invention not clear from the above will be understood from a review of the drawings and the description of the preferred embodiments which follow.

DESCRIPTION OF THE PREFERRED EMBODIMENTS

Figure 1:
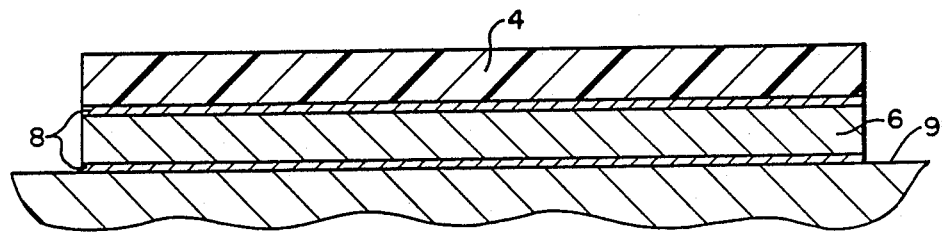
FIG. 1 is a sectional view of the two ply surface covering laminate of the invention.

The invention comprises a flexible radiation shielding composite material of two or more layers laminated together and further includes a suitable means, i.e., a layer for attaching an electrical ground to one of the layers which is comprised of metal foil. By "radiation shielding" herein is meant the at least partial attenuation of radiation on the electromagnetic spectrum ranging from wavelengths of approximately 1 Angstrom, i.e. the shorter wavelength X-ray radiation, ultraviolet radiation (approximately 4000 A), visible radiation (4000 to 7000 A), infrared radiation (wavelengths greater than 7000 A), Hertzian waves of $2.20 \times 10^6$ Angstroms, so-called "ground waves", all the way up to microwaves of 1 centimeter to 1 meter in wavelength.

The external covering layer of the inventive composite can provide desirable aesthetics in texture, print pattern and color, for example, and is generally a polymeric film. The covering material can also be a copolymeric film, wherein "copolymeric" as used herein means any combination of two or more polymeric materials blended together, reacted together, extruded together, or otherwise combined. The preferred polymeric material is a vinyl film, or polyvinylchloride film. Other polymers or copolymers serviceable in the present invention as the external covering material include, but are not limited to, polyethylene, polypropylene, styrene-butadiene, polyvinyl acetate, polyvinyl ether, polybutadiene, methyl methacrylate, natural rubber, styrene, acrylonitrile, phthalates, cellulose-acetate, cellulose butyrate, cellulose nitrate, acrylamide, polyurethane, maleic anhydride, polyethyl acrylate, polytetrafluoroethylene, and blends thereof.

The radiation shielding laminates further include a layer of metal foil. The metal of the metal foil is preferably aluminum, due to its light weight and relative low cost. Other metals envisioned within the scope of the present invention include tin, steel, iron, titanium, gold, silver, lead, nickel, copper, and zinc. Derivatives of the foregoing metals such as, but not limited to, the oxides thereof, are also included within the definition of "metal" herein. Mixtures, blends, and alloys of the metals are also operative as metal foils according to the present invention.

The word "foil" as used herein means any thin, continuous or nearly continuous planar surface of metal. Holes and gaps in the foil are generally not desirable because holes provide the potential for leakage of electromagnetic radiation through the surface-covering laminate. However, depending on the size and spacing of the holes, the nature of the object to be covered, and the cost/benefit comparison, for certain applications holes may be acceptable or even desirable.

The radiation shielding laminates of the invention also comprise an electrically conducting, seam-backing material positioned at the seams between adjacent sheets of laminates, whose function is to conduct electricity from one sheet to the other. The electrically conductive seam-backing material utilized can be, for example, a metal foil strip or a conductive metal foil adhesive tape, such as an aluminum tape backed with an adhesive.

In the present invention, electrical conductivity is continued from one laminate sheet to the next across the complete surface of the object to be covered by means of the electrically conductive sheets joined by the seam-backing material. With complete electrical conductivity across the surface of the object, a single point ground is achievable, whereby the surface of the entire object can be grounded, and thereby rendered radiation shielded, by a single point ground attached by conventional electrical methods. Without the electrically conductive seam-backing material a ground is necessary for each laminated sheet.

Films of the polymeric or copolymeric external covering materials can be supported according to the present invention by the preferred addition to the laminate of a layer of a backing material or jute that provides additional dimensional stability and impact resistance. Such materials can include, for example, paper fabric, confill, scrim, synthetic nonwoven synthetic fibers such as polyesters, polyacrylonitriles, nylons, polypropylene, polyethylene and the like, fiberglass, mineral fibers, rock wool, glass wool, and lignocellulosic particles, fibers or mats. It is desirable to use as the material providing dimensional stability and impact resistance a flame retardant or flame resistant material. The backing material can also be metal fibers, shavings, particulates, screens or matrices. The backing material also provides improved wear, tear and abrasion resistance to the complete laminate. It is preferred that the backing layer be laminated to the opposite side of the metal foil from the surface covering, decorative polymeric film, although, in the broadest embodiment, it can also be inserted in the middle of the three ply laminate.

According to the present invention, it is particularly preferred to have a scratch resistant coating on both sides of the metal foil. The scratch resistant coating facilitates handling and processing with reduced potential for holes or other structural deformations or irregularities. Many scratch resistant coatings for metal are known and all of the known scratch resistant coatings for metal are envisioned as useful within the scope of the present invention, as long as the coating when applied to the metal foil does not prevent the establishment of the requisite electrical conductivity from one laminate to an adjacent laminate by the seam-backing material. Thus, a preferred scratch resistant coating on the metal foil is cellophane, wherein the cellophane is applied to the metal foil at thicknesses ranging from about 0.5 to 10 mils. It has surprisingly been discovered that a scratch resistant, nonconducting cellophane coating of about 1 mil thickness applied to aluminum foil does not substantially impede the electrical conductivity between the aluminum foil of juxtaposed sheets through the seam-backing material. The scratch resistant coating, such as cellophane, can be applied to the metal foil by any of the known means including, but not limited to, spray coating, dip coating, transfer roll coating, and the like.

According to the present invention, it may also be desirable to have an optional adhesion promotion coating or treatment on one or both sides of the metal foil. Many adhesion promotion coatings or treatments for metal are known but the preferred coatings or treatments are polyvinylidene chloride, also commonly known as "Saran"; copolymers of vinylidene chloride and vinyl chloride; organofunctional silanes, such as, for example, aminopropyltrimethoxysilane, and gamma-glycidoxypropyltrimethoxysilane, and water based adhesives, such as polyvinyl acetate. The adhesion promotion coating or treatment of the scratch coating or the metal foil enhances the adhesion of the polymeric or copolymeric film and, if desired, the layer of backing material, to the metal foil. The adhesion promotion coating can be applied to the surface of the metal foil or the cellophane coating by any conventional technique including, but not limited to, spray coating, dip coating, transfer roll coating and the like.

The layers of material in the radiation shielding laminates of the present invention are held together by a suitable adhesive. According to the present invention, the adhesive can be, but is not limited to, a starch-based adhesive, a polyvinyl alcohol adhesive, a polyvinyl acetate adhesive, a hot melt adhesive, a water based latex adhesive and also, a variety of known pressure sensitive adhesives. The adhesive is desirably continuous throughout the cross-section of the laminate and coextensive with each next adjacent layer. The adhesive used to unite adjacent layers of the laminate should be capable of forming a permanent bond, and should not be injurious or corrosive to the bonded layers of the laminated surface-coverings. The techniques and equipment, such as pressure lamination and elevated temperature lamination, commonly used for laminating, will be evident to one of ordinary skill in the art.

Another preferred embodiment relates to a flexible, multilayer surface-covering, electro-magnetic radiation shielding laminate comprising (a) an outer layer of a polymeric or copolymeric film such as polyvinyl chloride; (b) a middle layer of metal foil; (c) an outer layer of a backing material which provides additional dimensional stability and impact resistance to the laminate; (d) a scratch resistant coating such as cellophane on each side of the metal foil layer between the foil and each outer layer; (e) an adhesive promotion layer such as Saran between the scratch resistant coating and an adhesive coat bonding both the polymeric and backing layers to the foil; and (f) an electrically conducting seam-backing material comprising a layer of a metal foil strip bonded over the seam of juxtaposed laminates by an electrically conductive adhesive. The surface-covering radiation shielding laminates of the present invention are applied to the object to be shielded, such as, but not limited to, luggage, furniture, computer equipment, clothing, walls, ceilings and floors. The adhesive means utilized to anchor the surface-covering laminates to the object may be the same as the adhesive means utilized to bond together the layers of the laminate. Alternatively, the laminate may be anchored to the object by a different adhesive or by nails, staples, rivets or any other conventional anchoring means. It should be noted, however, that nails, staples, or rivets create potential sites for radiation leakage and tear propagation.

The preferred method of attaching the radiation shielding laminates of the invention to a surface such as a wall involve first attaching a strip of the electrically conducting seam-backing material to the wall with an adhesive at desired intervals. Upon completion, the sections of the laminate are then bonded to the wall surface, with each edge being bonded to one side of the strip of seam-backing material. Thereby, the strip serves to bridge the gap between the conductive strips of the laminates.

A preferred embodiment of the present invention utilizes a stronger, permanent adhesive for bonding the foil side of the laminate to the electrically conducting seam-backing material and the wall while using a slightly weaker adhesive to bond the polymeric or copolymeric covering material and backing material, if any, to the metal foil. In this manner the decorative polymeric or copolymeric covering material can be peeled off the metal foil while the metal foil remains intact, attached to the wall. A new covering material of alternative decorative design or texture can then be applied over the metal foil by means of an adhesive.

Electromagnetic radiation can leak around and through seams that occur between adjacent metal foil laminates, thereby weakening the protection against electronic eavesdropping. In applying the surface-covering radiation shielding laminates of the present invention to an object, it is therefore essential that electrical conductivity is continued from one laminate sheet to the next across the complete surface of the object to be covered by means of the electrically conductive seam-backing material. With complete electrical conductivity across the surface of the object, a single point ground is achievable, thus enabling the surface of the entire object to be grounded, and thereby rendered radiation shielded, by a single point ground. As mentioned above, the electrically conductive seam-backing material utilized is a metal foil strip or a conductive metal foil adhesive tape, such as an aluminum tape backed with an adhesive that is non destructive of electrical conductivity.

The invention further comprises a process for providing at least partial electromagnetic radiation shielding for the surface of an object such as a building, computer or room. The process comprises attaching an electrical ground to the flexible, multilayer surface-covering laminate after covering the surface of the object to be covered with the laminate, the attaching occurring at a location beneath the seam formed by adjoining laminates in which a separate electrically conductive seam-backing material is attached to the edge and back of each laminate sheet prior to the laminate sheets being bonded to a desired object. Pressure sensitive adhesives and contact cement, for example, are effective in bonding the electrically conductive seam-backing material to the metal foil and also to the surface of the object to be covered. The adhesive, as mentioned, supra, must not be so thick or of an insulative nature as to significantly impede the electrical conductivity from the metal foil to the electrically conductive seam-backing material.

FIG. 1 shows a two ply laminate bonded to a substrate such as a wall. It includes a flexible PVC layer 4 bonded to a thin metal foil film 6, such as aluminum, by a thin layer 8 of Saran or another suitable adhesion promoting coating and an adhesive. A corresponding Saran-adhesive layer 8 may be used to affix the laminate to a substrate 9.

Figure 2:
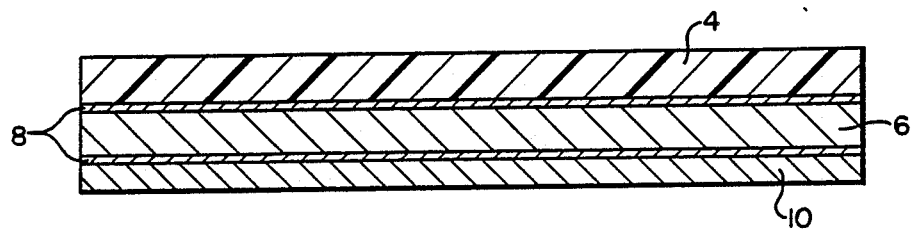
FIG. 2 is a sectional view of the preferred three ply surface covering laminate of the invention.

FIG. 2 shows an alternative cross-sectional embodiment which includes the layers of FIG. 1 and a backing layer 10 bonded to the foil layer 6 by another layer of adhesive 8.

Figure 3:
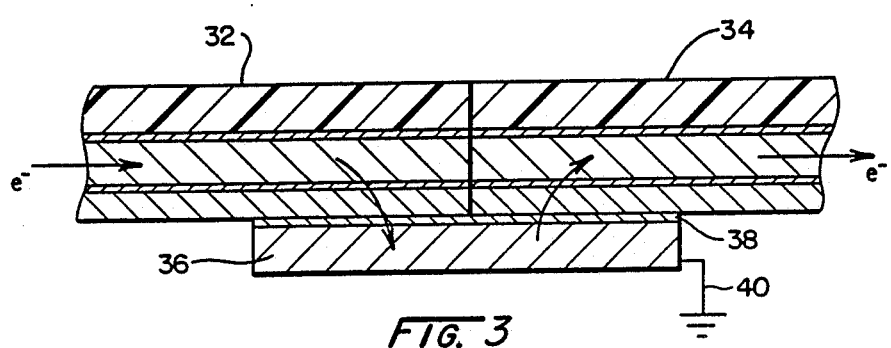
FIG. 3 is a sectional view of two adjacent surface covering laminates of FIG. 2, which are connected with a layer of an electrically conductive seam-backing material.

FIG. 3 shows another embodiment in which two adjacent radiation shielding laminates 32 and 34 having the structure described in FIG. 2 are each bonded to an electrically conductive seam-backing material 36, such as a thin layer of metal foil by, e.g., a layer 38 of a suitable pressure sensitive adhesive. The adhesive layer is sufficiently thin so as not to impede the electrical conductivity of the metal foil to the conducting seam-backing material and indeed the adhesive 38 may itself be electrically conducting. Layer 36 can be attached to an electrical ground, as shown at 40. It may be preferable to trim at the corners of the laminates sections of the backing layer 10 and the adhesive layer 8 in embodiments where they are the outermost layers, so as to enable the electrically conductive seam backing material 36 and its layer of adhesive 38 to fit into the removed section and thus form a smooth outer layer, thereby enabling easy application to the surface of the wall or other substrate to be covered (see FIG. 6).

Figure 4:
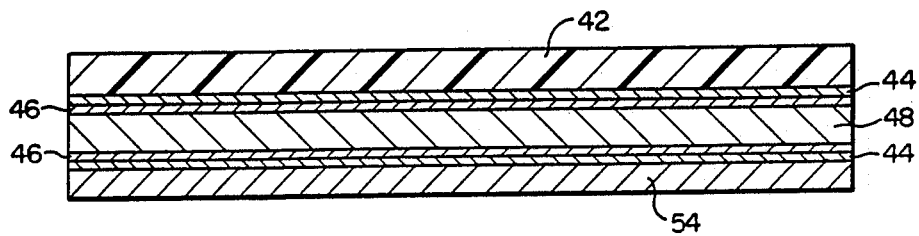
FIG. 4 is a sectional view of another preferred surface covering laminate of the invention.

FIG. 4 illustrates another embodiment including an outer layer 42 of polyvinyl chloride, a thin adhesive promotion layer 44 of Saran and an adhesive which bonds the PVC to a cellophane scratch resistant coating 46, which is a thin film on the outer layer of an aluminum foil 48. On the opposite side of foil 48 are located identical layers 46 and 44 of cellophane and Saran-adhesive respectively, whose function is the same as described, supra. An outer backing layer 54 is bonded to the lower Saran-adhesive layer 44.

Figure 5:
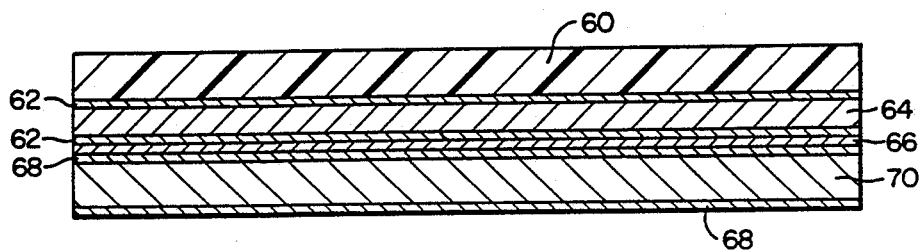
FIG. 5 is a sectional view of still another preferred surface covering laminate of the invention.

FIG. 5 illustrates another embodiment including an outer layer 60 of polyvinyl chloride, a thin water based layer of adhesive 62 which bonds the PVC to a backing layer 64. On the opposite side of backing layer 64 is another thin layer of water based adhesive 62, which is coated onto a thermosetting adhesive promotion layer 66, such as Saran. The Saran layer 66 acts as a primer coat to enhance the bonding of the upper structure to a cellophane scratch resistant coating 68, which is a thin film on the outer layer of an aluminum foil 70. On the opposite side of foil 70 is located another scratch resistant layer 68. A coating of Saran (not shown) is usually applied over the lower scratch resistant coating. The resulting laminate of FIGS. 4 and 5 can also, of course, be utilized in the embodiment set forth in FIG. 3.

Figure 6:
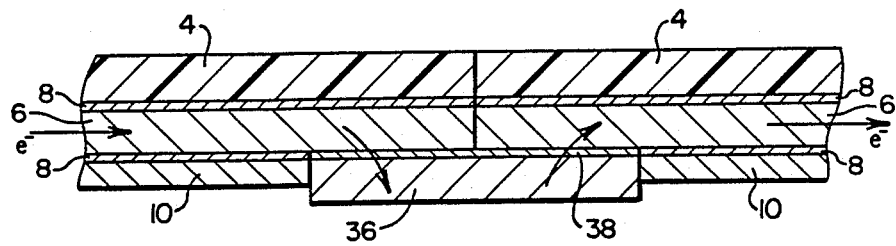
FIG. 6 is a sectional view of still another preferred surface covering laminate in which the non-conducting layers are cut away to enable the insertion of the electrically conducting seam-backing material directly to the sandwiched conducting layer of the laminate.

FIG. 6 illustrates another embodiment in which a laminate, as that shown in FIG. 2, containing a layer 8 of adhesive bonding an outer backing layer 10 to the aluminum foil layer 6 has been cut away a sufficient amount to enable the insertion into the open space of the electrically conducting seam-backing material, comprised of adhesive layer 36 and the electrically conducting strip 38. Through utilization of such a procedure, a smooth inner surface is created which can be easily bonded to the desired substrate. The stripping of layer 10 may be necessary under some circumstances to ensure the electrical bridge from one sheet to another; if the layer 10 is too thick it will be an insulator.

Laminate materials of the present invention have demonstrated an ability to absorb greater than 96% of incident microwave radiation at 10 GHz.

By way of further illustration of the present invention and without placing limitations on the present invention, the following examples are provided:

EXAMPLE 1

This example discloses the preparation of the two ply embodiment of the invention, in which a fifty inch wide laminate was formed by laminating a PVC film to the dull side of an aluminum foil which contained a thin layer of cellophane on each side and a layer of Saran on the side to be laminated. The PVC film was first preheated to at least 270°–280° F. before passing through the heated laminating nip. The foil layer was first positioned on a letoff jack positioned just above the laminating nip, the laminating nip temperature was kept between 200°–240° F. and a pressure of 40 psi was exerted during laminating of the two ply article. The resulting laminate was pulled out of the nip and the vinyl side was then embossed. The formed laminate was cooled before being trimmed to a forty-five inch width.

Figure 7:
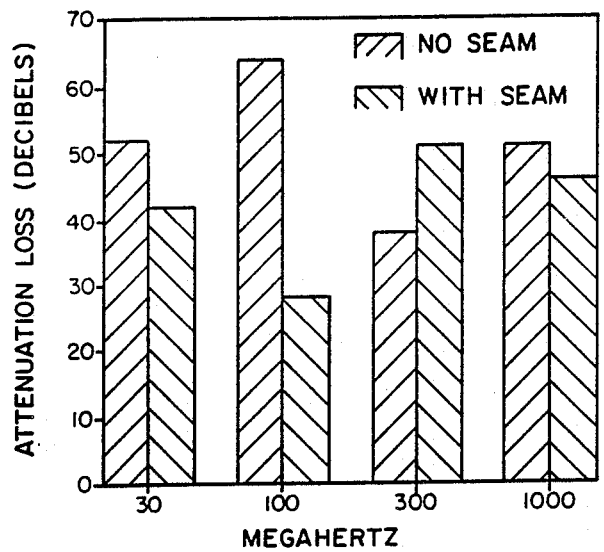
FIG. 7 & 8 are bar charts which illustrate the radiation shielding effectiveness of the laminates of the invention.

FIG. 7 discloses the electromagnetic radiation shielding effectiveness of the two ply film, in which the radiation attenuation loss (in decibels) is plotted as a function of the frequency of the electromagnetic radiation over a set of frequencies ranging from 30–1000 Megahertz. Additionally, the Figure also illustrates the attenuation loss for the embodiment in which the two ply sheet is first cut into equal sections which are aligned adjacent each other at their seams, which were connected by a thin strip of electrically conducting seam backing foil made by 3M, Inc. under the trade name "Scotch 1170" The results indicate that, except for the attenuation test conducted at 300 Megahertz, utilization of the seam backing foil substantially improves the radiation shielding effectiveness of the laminate. The particular deviant result may be due to the layer acting as a capacitor.

EXAMPLE 2

Utilizing the same apparatus and procedure as in Example 1, a forty-nine inch wide, two ply laminate was first formed by laminating a PVC film to the aluminum foil which has been coated with Saran as in Example 1. Then, a three ply laminate was formed by laminating to outer the aluminum foil side a 4.81 yds/lb fabric sheet which was made from a 50–50% blend of polyester and cotton and containing 33×34 threads/in. The aluminum foil outer side was first coated with 0.75 ounces/yd$^2$ (dry wt.) of a low temperature curing water based latex adhesive sold by Hyde Research, Inc., under the trade name "#1194" During this laminating step, the temperature of the fabric was always kept below 230° F. to prevent blistering. The resulting three ply laminate was then embossed at a nip temperature kept below 200° F. In this example the coating weight of the water based adhesive utilized must be carefully controlled for effective adhesion. The resulting laminate was again cooled before being trimmed to a forty-six inch width.

Figure 8:
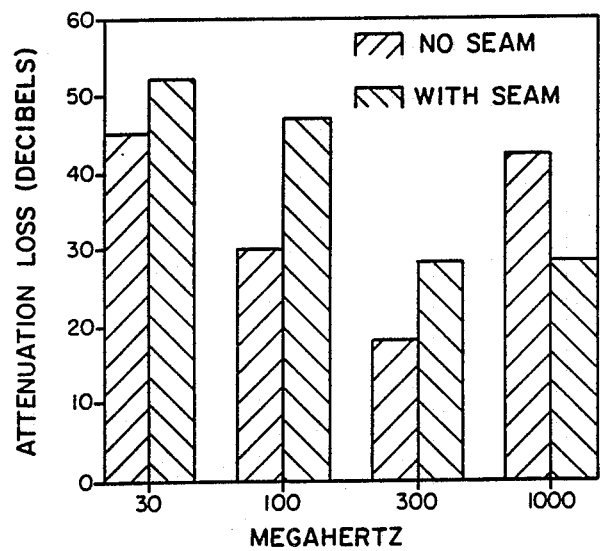

FIG. 8 discloses an identical plot as FIG. 7 for illustrating the radiation shielding effectiveness of the three ply laminate for both of the embodiments, i.e., with and without a seam backing foil as described in Example 1. The results again indicate that utilization of the seam backing foil substantially improves the shielding effectiveness for frequencies which are at least in excess of 300 Megahertz.

The shielding laminates of the invention provide substantially greater shielding than that which can be obtained from an ordinary uncoated surface, e.g., about 0–10% attenuation loss.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

Having thus described the invention, what is claimed is:

1. A flexible, surface-covering, radiation shielding laminate comprising:
   (a) a layer of one of a polymeric or copolymeric film;

(b) a layer of electrically conducting foil having two sides;

(c) a scratch resistant coating bonded to one of said sides of said foil;

(d) an adhesive layer bonding the film to one of said sides of the foil; and (e) an electrical ground attached to the layer of metal foil.

2. A laminate as claimed in claim 1 wherein polymer or copolymer used to form the polymeric or copolymeric film is selected from the group consisting of polyvinylchloride, polyethylene, polypropylene, styrenebutadiene, polyvinyl acetate, polyvinyl ether, polybutadiene, methyl methacrylate, natural rubber, styrene, acrylonitrile, phthalate, cellulose-acetate, cellulose-butyrate, acrylamide copolymer, polyurethane, maleic anhydride copolymer, cellulose nitrate, polyethyl acrylate, and polytetrafluoroethylene.

3. A laminate as claimed in claim 1 further comprising an additional layer of a support material bonded to the side of the foil layer not having the adhesive layer, to provide added dimension stability and impact resistance to the laminate.

4. A laminate as claimed in claim 3 wherein the layer of support material which provides added dimensional stability and impact resistance to the laminate is selected from the group consisting of woven and non woven synthetic fibers, mineral fiber, fiberglass, rock wool, glass wool, and lignocellulosic particles, fibers or mats.

5. A laminate as claimed in claim 1 wherein the electrically conducting foil is selected from the group consisting of aluminum, tin, steel, iron, titanium, gold, silver, lead, nickel, copper, zinc, oxides thereof, and mixtures thereof.

6. A laminate as claimed in claim 1 wherein the adhesive is selected from the group consisting of polyvinyl alcohols, polyvinyl acetates, hot melts, water based latexes and starch based adhesives and mixtures thereof.

7. A laminate as claimed in claim 1 further comprising a scratch resistant coating on both sides of the foil, and an adhesion promotion coating on at least one of the sides of the scratch resistant coatings.

8. A laminate as claimed in claim 7 wherein the scratch resistant coating is cellophane.

9. A laminate as claimed in claim 7 wherein the adhesion promotion coating is one of polyvinylidene chloride or a copolymer of vinylidene chloride and vinyl chloride.

10. A laminate as claimed in claim 1 wherein the means for attaching an electrical ground to the layer of foil is an electrically conducting seam-backing material.

11. A process for providing electromagnetic radiation shielding for an object, said process comprising the steps of:

(a) preparing a flexible, surface-covering laminate, comprising:

(1) forming a layer of one of a polymeric or copolymeric film;

(2) forming a layer of metal foil having two sides;

(3) applying a scratch resistant coating to at least one side of the foil; and (4) bonding the layers together with an adhesive;

(b) covering the surface of the object with the formed laminate; and (c) attaching an electrical ground to the layer of metal foil, whereby electromagnetic radiation is retarded from passing through the laminate.

12. The process as claimed in claim 11 wherein preparing the surface-covering laminate further comprises bonding a layer of a support material to one side of the metal foil layer to provide added dimensional stability and impact resistance to the laminate.

13. The process as claimed in claim 11 wherein an adhesion promoting coating is coated on at least one of the opposite sides of the scratch resistant coating.

14. The process as claimed in claim 13 wherein the laminate include ends, placing the ends in juxtaposed position to form a seam, applying to the surface of the object covered by the laminate and at a location beneath the seam formed by the juxtaposed ends, an electrically conductive seam-backing material, so as to achieve a continuous electrically conductive ground across the ends.

15. The process as claimed in claim 14 wherein the electrically conductive seam-backing material is selected from the group consisting of a metal foil strip and a metal foil adhesive tape.

16. The process as claimed in claim 11 wherein the laminate include ends, placing the ends in juxtaposed position to form a seam, applying to the surface of the object covered by the laminate and at a location beneath the seam formed by the juxtaposed ends, an electrically conductive seam-backing material, so as to achieve a continuous electrically conductive ground across the ends.

17. The process as claimed in claim 16 wherein the electrically conductive seam-backing material is selected from the group consisting of a metal foil strip and a metal foil adhesive tape.

18. The process as claimed in claim 11 wherein the object covered is selected from the group consisting of the walls or floor or ceiling of a room, luggage, furniture, computer equipment, machinery, and clothing.

19. The process as claimed in claim 11 wherein a plurality of surface-covering laminates are adhered to an object, each laminate having ends, aligning ends of adjacent laminates to form seams, attaching a plurality of strips of electrically conducting seam-backing material to the object at said seams, each strip having two sides and positioned at predetermined intervals;

covering the surface of the object by bonding each surface-covering laminate to one of the electrically conducting seam-backing material to provide electrical contact between the adjacent laminates.

* * * * *